US012599030B2

(12) United States Patent
Lorz et al.

(10) Patent No.: US 12,599,030 B2
(45) Date of Patent: Apr. 7, 2026

(54) POWER SEMICONDUCTOR MODULE SYSTEM AND METHOD FOR PRODUCING THE POWER SEMICONDUCTOR MODULE SYSTEM

(71) Applicant: Siemens Aktiengesellschaft, Munich (DE)

(72) Inventors: Roland Lorz, Röttenbach (DE); Philipp Kneißl, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 428 days.

(21) Appl. No.: 18/019,294

(22) PCT Filed: Jul. 27, 2021

(86) PCT No.: PCT/EP2021/071023
§ 371 (c)(1),
(2) Date: Feb. 2, 2023

(87) PCT Pub. No.: WO2022/028957
PCT Pub. Date: Feb. 10, 2022

(65) Prior Publication Data
US 2023/0274990 A1 Aug. 31, 2023

(30) Foreign Application Priority Data
Aug. 5, 2020 (EP) .................................... 20189702

(51) Int. Cl.
*H01L 25/00* (2006.01)
*H01L 23/053* (2006.01)
(Continued)

(52) U.S. Cl.
CPC .......... *H01L 23/053* (2013.01); *H01L 25/072* (2013.01); *H01L 25/18* (2013.01); *H01L 25/50* (2013.01)

(58) Field of Classification Search
CPC ..... H01L 23/053; H01L 25/072; H01L 25/18; H01L 25/50
See application file for complete search history.

(56) References Cited

U.S. PATENT DOCUMENTS 9,129,959 B2 * 9/2015 Fuergut ................. H01L 23/498
2004/0207968 A1 10/2004 Martin et al.
(Continued)

FOREIGN PATENT DOCUMENTS

DE 19646396 5/1998
DE 202013105809 1/2014
(Continued)

OTHER PUBLICATIONS

PCT International Search Report dated Nov. 11, 2021 based on PCT/EP2021/071023 filed Jul. 27, 2021.

*Primary Examiner* — Thao P Le
(74) *Attorney, Agent, or Firm* — Cozen O'Connor

(57) ABSTRACT

A method for producing a power semiconductor module system includes producing a first and second power semiconductor modules that each have a power semiconductor circuit, connecting first and second contact electrodes to the respective power semiconductor circuits, and partially enclosing the power semiconductor modules in a common housing, wherein the first and second contact electrodes of the two power semiconductor modules are each led through the common housing through a cut-out and where the common housing has first, second and third contacting regions, where the first and second contact electrodes of the first power semiconductor module contact together in the first contacting region, the first and second contact electrodes of the second power semiconductor module contact together in the second contacting region, the second contact electrode of the first power semiconductor module and the (Continued)

second contact electrode of the second power semiconductor module contact together in the third contacting region.

14 Claims, 5 Drawing Sheets

(51) Int. Cl.
*H01L 25/07* (2006.01)
*H01L 25/18* (2023.01)

(56) References Cited

U.S. PATENT DOCUMENTS

| | | | | |
|---|---|---|---|---|
| 2006/0274561 A1 * | 12/2006 | Ahmed | ................. | H02M 7/003 |
| | | | | 361/699 |
| 2011/0310585 A1 * | 12/2011 | Suwa | ................ | H01L 23/49575 |
| | | | | 257/691 |
| 2014/0231982 A1 | 8/2014 | Ogawa | | |
| 2014/0367736 A1 | 12/2014 | Iizuka et al. | | |
| 2015/0279753 A1 * | 10/2015 | Inaba | ................ | H01L 23/49811 |
| | | | | 257/77 |
| 2022/0328368 A1 * | 10/2022 | Herbst | .................. | H01L 23/053 |
| 2022/0415730 A1 * | 12/2022 | Reiter | ................... | H01L 23/145 |
| 2025/0286031 A1 * | 9/2025 | Kawano | ................. | H01L 25/16 |

FOREIGN PATENT DOCUMENTS

| | | |
|---|---|---|
| DE | 102014115812 | 5/2016 |
| EP | 0750345 | 12/1996 |
| EP | 1467607 | 10/2004 |

* cited by examiner

POWER SEMICONDUCTOR MODULE SYSTEM AND METHOD FOR PRODUCING THE POWER SEMICONDUCTOR MODULE SYSTEM

CROSS-REFERENCE TO RELATED APPLICATIONS

This is a U.S. national stage of application No. PCT/EP2021/071023 filed 27 Jul. 2021. Priority is claimed on European Application No. 20189702.2 filed 5 Aug. 2020, the content of which is incorporated herein by reference in its entirety.

BACKGROUND OF THE INVENTION

1. Field of the Invention

The invention relates to a power semiconductor module system, a housing for the power semiconductor module system, a power semiconductor module system assembly and a to method for producing the power semiconductor module system.

2. Description of the Related Art

Power semiconductor circuits are generally packaged in housings. Particularly for higher powers, a number of power semiconductor circuits are integrated into one housing to achieve higher currents. Often, the semiconductors of a "half-bridge" are integrated together in a housing to ensure low-inductance circuitry.

The housing must perform a number of tasks, meaning that the effort involved in development and manufacture (injection molds, bending tools, and/or automation) is very high and therefore only profitable for high volumes.

If the power of a power semiconductor module is intended to be higher still, then another and larger power semiconductor circuit must be used to provide the required semiconductor surface. In general, the volumes for power semiconductor modules fall with increasing maximum module rated current (chip area), i.e., the larger the module the smaller the module volumes required/achievable.

On the other hand, as the module size increases so does the complexity of the module. The design effort, particularly for the baseplate and the housing, increases disproportionately. The same applies to the actual production process. Here, firstly, the number of process steps required (for example, for repeated soldering) can. Secondly, other process steps may be necessary such as ultrasound welding. This is then felt above all in a higher reject rate (yield). In addition, for low power semiconductor module volumes a higher degree of production automation is not financially viable.

Alternatively, the power of a power semiconductor module can also be increased by connecting a number of power semiconductor circuits in parallel within the power semiconductor module. For this purpose, a busbar for the individual power semiconductor circuits, the drivers and the cooling system must be specially developed to ensure sufficient static and dynamic power symmetry. The design of the power semiconductor module itself (the electrical connections and the internal layout) can have a significant influence on the power distribution within the power semiconductor module.

In addition, the modules connected in parallel must normally be selected for their electrical properties, for example, the forward voltage to one another. For logistics or in the event of a repair in particular, this can be highly complex.

To lessen or overcome the problem of low volumes and high rejection rates for large power semiconductor modules, various designs can be used. The power semiconductor module can be broken down into smaller subunits. These subunits are then pretested as far as possible.

Circuit carriers such as Direct Copper Bonds (DCBs) can, as far as possible, be pre-produced, for example, by soldering the chips and the bonds of the connections within the DCB. These pre-produced DCBs can then be tested with lower voltage. However, these tests can only detect a proportion of the possible defects.

The individual subunits are then assembled to form a complete power semiconductor module and have the further components (for example, baseplate, housing, contact electrodes, and/or gel etc.) added. Following assembly the power semiconductor module can then lastly undergo full electrical testing.

EP 1 467 607 B1 discloses a power switch module with contact electrodes mounted on a housing of a power semiconductor.

DE 20 2013 105 809 U1 discloses a power semiconductor module and a contacting arrangement for contacting switch element contacts.

SUMMARY OF THE INVENTION

It is an object of the invention to provide a power semiconductor module system and an associated production method, which allows simple and efficient scaling of an electrical current to be switched.

This and other objects and advantages are achieved in accordance with the invention by a power semiconductor module system, a housing for the power semiconductor module system, a power semiconductor module system assembly and by a method for producing the power semiconductor module system, where the power semiconductor module system in accordance with the invention has two power semiconductor modules with a common housing. Here, each power semiconductor module has a power semiconductor circuit, where the common housing at least partially surrounds the two power semiconductor circuits, where the power semiconductor modules each have a first contact electrode and a second contact electrode, which are each electrically conductively connected to the power semiconductor circuit and which are each guided outward through the housing through a recess in the common housing made for this purpose, where the common housing has a first, a second and a third contacting region, where the first contact electrode and the second contact electrode of the first power semiconductor module can be contacted in the first contacting region, where the first contact electrode and the second contact electrode of the second power semiconductor module can be contacted in the second contacting region, and where the second contact electrode of the first power semiconductor module and the second contact electrode of the second power semiconductor module can be contacted together in the third contacting region.

The power semiconductor circuit can be used to control and switch electric currents of a comparatively high strength, for example more than 50 amperes. The power semiconductor circuit can comprise power semiconductor components, such as Insulated Gate Bipolar Transistor (IGBTs), Metal Oxide Semiconductor Field Effect Transistors (MOSFETs), thyristors, diodes and similar, arranged on a substrate, and which via a conductive layer of the substrate, together with bonding wires and/or a composite film, can be connected with one another electrically conductively. The power semiconductor components arranged on the substrate can be electrically connected to form a single or to multiple half-bridge circuits, which are used, for example, for rectifying and inverting electric voltages and currents.

The tasks of a housing for a power semiconductor module system can include the mechanical relief, guidance and insulation of the individual contact electrodes. In accordance with the invention, any housing can be used that at least partially surrounds the two power semiconductor circuits to perform the above functions among others. It is, as it were, in the context of the invention if the two power semiconductor modules have additional (separate) housings, which (partially) surround the individual power semiconductor modules in the form of a cast frame. It is also possible for the "common housing" within the meaning of the invention to represent a kind of "housing cover" that covers both the power semiconductor modules and the power semiconductor module circuits contained therein.

The contact electrodes have the task of transmitting electric power to the semiconductor circuit. For this purpose, the contact electrodes are configured such that they can be electrically conductively connected with an external voltage/current source (for example, by soldering, welding or a mechanical connection such as crimping or screwing). To this end, the contact electrodes must at least, in partial regions, have a not inconsiderable electric conductivity to be able to transmit the power to the semiconductor circuit. The contact electrodes can, for example, be made of copper, iron-nickel or electrically conductive silicon.

The power semiconductor module system in accordance with the invention has a housing with at least three contacting regions. These are provided so that two contact electrodes in one of the contacting regions can be each contacted with the housing.

The power semiconductor module system in accordance with the invention allows two completely autonomous power semiconductor modules to be easily mechanically and electrically connected to one another for use at higher powers, without the need for a change to the actual power semiconductor circuits. Advantageously, it is now possible for the individual power semiconductor modules not to be grouped next to one another, which means the resulting power loss is not so heavily concentrated. Consequently, the design of a cooling system necessary for the power semiconductor module system can be significantly simplified.

The connection surface/contacting possibilities are increased as a result of the power semiconductor module system in accordance with the invention. The individual power semiconductor modules can be pre-produced and fully tested before they are assembled into the large power semiconductor module system. Overall, fewer rejects occur (higher module production yield). This results in a drop in the value of any defective individual part and consequently in an improvement in the cost position.

Preferably, the first contact electrode and the second contact electrode of the first power semiconductor module are contacted together in the first contacting region with an external voltage/current source, the first contact electrode and the second contact electrode of the second power semiconductor module are contacted together in the second contacting region with an external voltage/current source, and the second contact electrode of the first power semiconductor module and the second contact electrode of the second power semiconductor module are contacted together in the third contacting region with an external voltage/ current source. The respective external voltage/current source is advantageously a single (the same) voltage/current source.

The number of contact electrodes and contacting regions is not limited to the quantity outlined above. Rather, this is a minimum configuration. Accordingly, the power semiconductor module system can have an integer multiple of two first and two second contact electrodes and a multiple of three contacting regions, where the contact electrodes and the contacting regions are each configured on the housing as explained above. It is, for example, possible for the housing to have nine contacting regions, and for each power semiconductor module to have three first and three second contact electrodes, so that the power semiconductor module system has a total of twelve contact electrodes.

It should be understood it is also possible for the power semiconductor module system to have additional contacting regions, to be able to secure the contact electrodes in additional regions (possibly indirectly using a busbar) to the housing, in order inter alia to increase the stability of a connection of the housing to the other components of the power semiconductor module system.

In an advantageous embodiment of the invention, the first contact electrode and the second contact electrode can each be bent around an edge of the housing. For this, the edges preferably have a rounding to facilitate bending of the contact electrodes. The edges are preferably configured in the region of the recesses, through which the contact electrodes are each guided outward through the housing. In other words, the contact electrodes, which following the execution of the holes in the housing are, for example, configured vertically to an outer face of the housing, are bent into a "horizontal" position on the outer face of the housing. In the contacting regions, the contact electrodes bent there can then be contacted with an external voltage/current source.

In the region of the recesses in which the contact electrodes are guided outward through the housing, these can be surrounded by an electrically insulating material. This material can, for example, be injected into the recesses.

As part of a particularly preferred embodiment of the invention, the housing has a recess in each of the contacting regions for receiving a screw, into which a threaded part is preferably inserted, where the recesses, and preferably the threaded part, are configured to receive a screw in order to contact the contact electrodes in each contacting region with an external voltage/current source, preferably on an outer face of the housing, where the contact electrodes preferably also have a recess (preferably a drill hole) for receiving the screw. Comparable attachment options exist, but the screw connection is an established and well-suited method for connecting materials such as the contact electrodes and the external voltage/current source together. To secure the screw connection, the corresponding threaded part (arranged on an inner side of the housing) can be used. The threaded part can, for example, be a nut. In order to compensate for tolerances, the recesses in the contact electrodes can each be configured as a longitudinally extended hole (or elongated hole).

The housing is preferably configured substantially as a rectangle with four large-area longitudinal sides and two smaller-area end faces, where the contacting regions are located in a central region of one of the four longitudinal sides. In other words, the contacting regions are arranged centrally in the housing. The advantages of this are as follows:

A symmetrical layout within the individual power semiconductor modules is possible (this is particularly suitable for parallel circuits of semiconductor chips);

Within the two power semiconductor modules, no long conductor structures develop, so that the two power semiconductor modules have less influence on one another.

The above-mentioned objects and advantages in accordance with the invention are also achieved by a housing for a power semiconductor module system, where the power semiconductor module system is configured in accordance with the disclosed embodiments.

The above-mentioned objects and advantages in accordance with the invention are also achieved by a power semiconductor module system assembly with a plurality of power semiconductor module systems, which is configured in accordance with the disclosed embodiments.

The objects and advantages are also achieved in accordance with the invention by a method for producing a power semiconductor module system that includes:

a) producing a first power semiconductor module and a second power semiconductor module, where the power semiconductor modules each have a power semiconductor circuit;

b) connecting a first contact electrode and a second contact electrode with the respective power semiconductor circuit, preferably via soldering or ultrasound welding;

c) at least partially surrounding the two power semiconductor modules with a common housing, where the first contact electrode and the second contact electrode of the two power semiconductor modules are each outwardly guided through the common housing through a recess in the common housing made for this purpose, where the common housing has a first contacting region, a second contacting region and a third contacting region, where the first contact electrode and the second contact electrode of the first power semiconductor module can be contacted together in the first contacting region, the first and the second contact electrode of the second power semiconductor module can be contacted together in the second contacting region, and the second contact electrode of the first power semiconductor module and the second contact electrode of the second power semiconductor module can be contacted together in the third contacting region.

In an additional step, the first contact electrode of the first power semiconductor module and the second contact electrode of the first power semiconductor module can be bent and contacted together with an external voltage/current source in the first contacting region of the common housing, the first contact electrode of the second power semiconductor module and the second contact electrode of the second power semiconductor module are bent and contacted together with an external voltage/current source in the second contacting region of the common housing, and the second contact electrode of the first power semiconductor module and the second contact electrode of the second power semiconductor module are bent and contacted together with an external voltage/current source in the third contacting region of the common housing, where each contacting preferably occurs with the help of a screw.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The characteristics, features and advantages of this invention described above and the way in which these are achieved, will become clearer and easier to understand from the following description of exemplary embodiments, which are explained in more detail in conjunction with the drawings, in which.

DETAILED DESCRIPTION OF THE EXEMPLARY EMBODIMENTS

Figure 1:
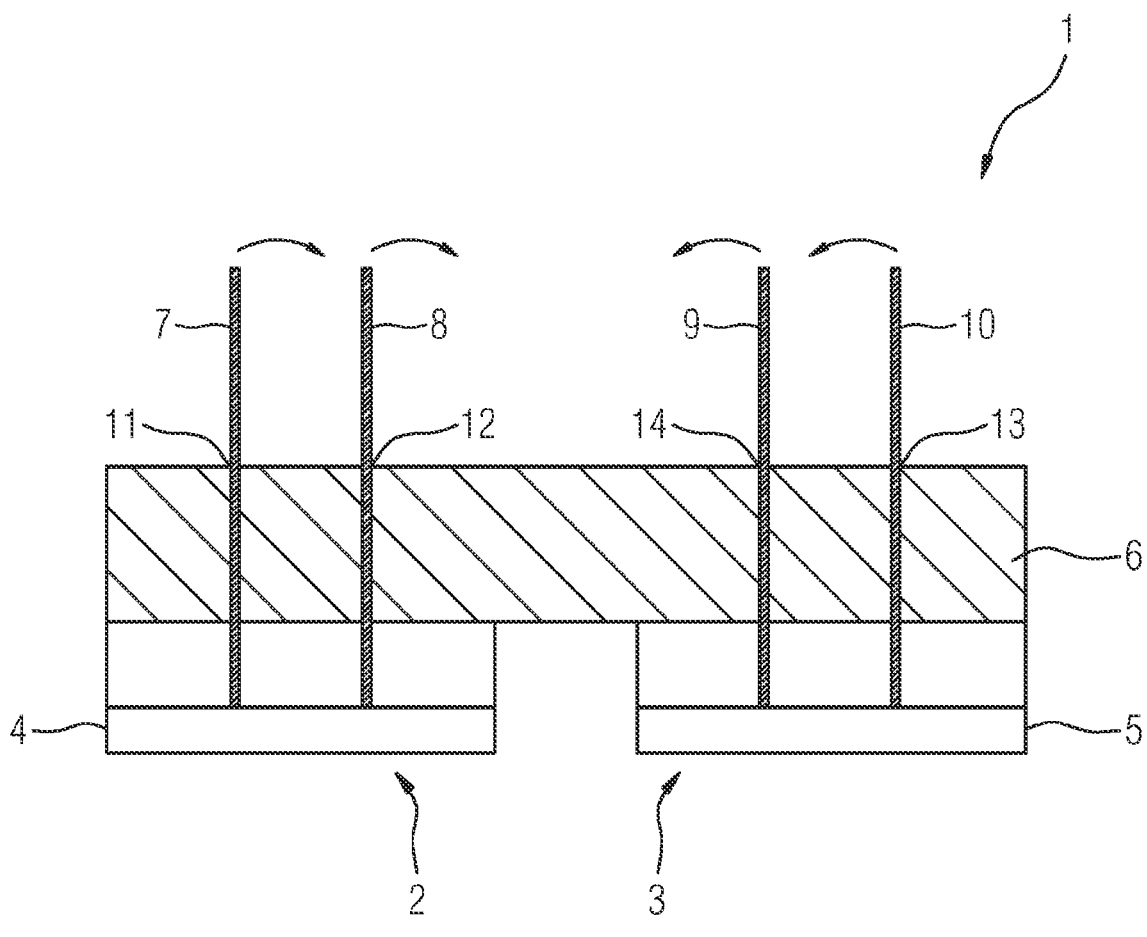
FIG. 1 a power semiconductor module system in accordance with a first embodiment.

FIG. 1 shows a cross-section of a power semiconductor module system in accordance with the invention 1. The power semiconductor module system 1 has two power semiconductor modules 2, 3. Each power semiconductor module 2, 3 has a power semiconductor circuit 4, 5, respectively. The two power semiconductor modules 2, 3 have a common housing 6, which surrounds within it power semiconductor circuits 4, 5 at least partially.

The first power semiconductor module 2 has a first contact electrode 7 and a second contact electrode 8. The second power semiconductor module 3 also has a first contact electrode 9 and a second contact electrode 10. The contact electrodes 7, 8, 9, 10 are each electrically conductively connected with the respective power semiconductor circuit 4, 5.

Figure 2:
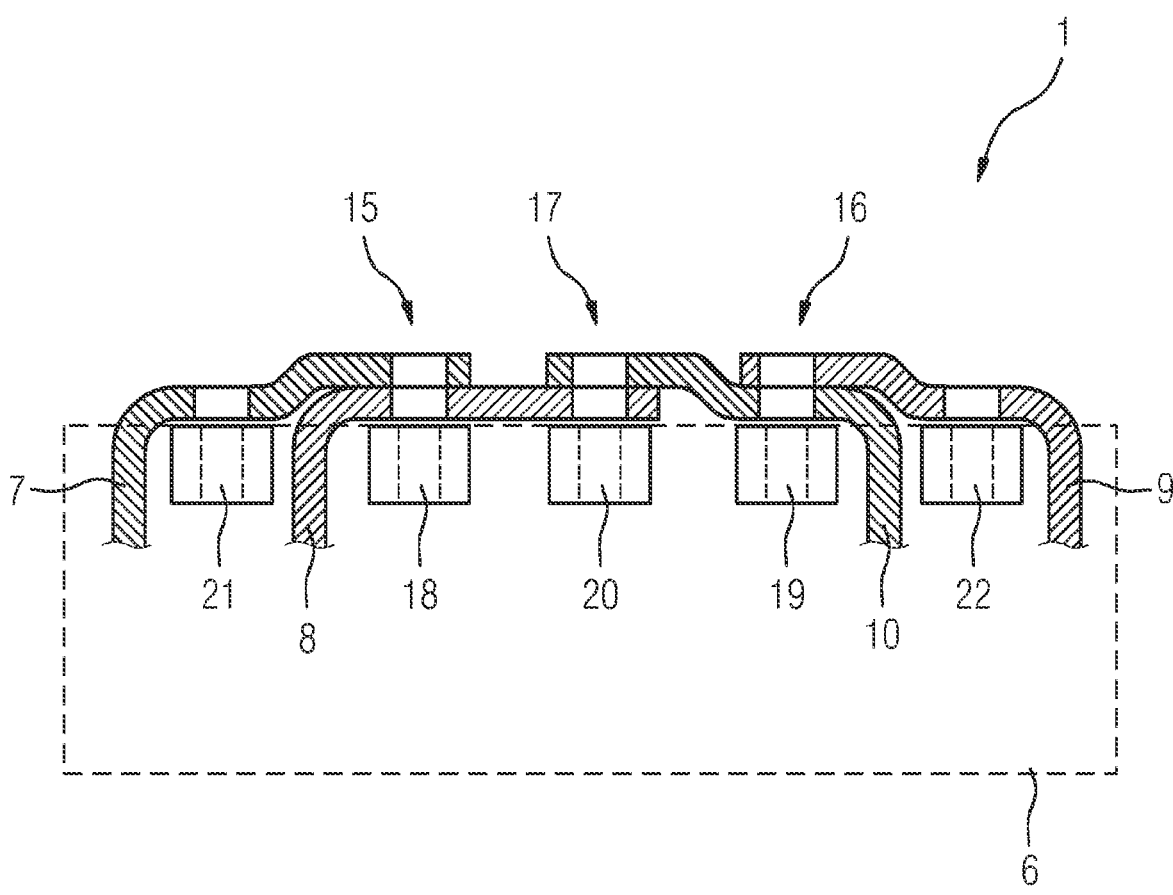
FIG. 2 is a cross-sectional illustration of a power semiconductor module system in accordance with a second embodiment.

The contact electrodes 7, 8, 9, 10 are outwardly guided through the housing 6 through correspondingly configured recesses 11, 12, 13, 14. Once they have passed through the housing 6, the contact electrodes 7, 8, 9, 10 can be bent such that they rest substantially flat against an outer face of the housing 6. This aspect is illustrated in FIG. 2. Here, the housing 6 is shown simply by a dashed line. The housing 6 has a first contacting region 15, a second contacting region 16 and a third contacting region 17. In the first contacting region 15, the first contact electrode 7 and the second contact electrode 8 of the first power semiconductor module 4 can be connected together with an external voltage/current source (not shown). In the second contacting region 16, the first contact electrode 9 and the second contact electrode 10 of the second power semiconductor module 5 can be connected together with an external voltage/current source (not shown). In the third contacting region 17, the second contact electrode 8 of the first power semiconductor module 4 and the second contact electrode 10 of the second power semiconductor module 5 can be connected together with an external voltage/current source (not shown).

In each of the contact electrodes 7, 8, 9, 10, there is a circular recess, through which the screw can be guided to contact the contact electrodes 7, 8, 9, 10 with an external voltage/current source. In each of contacting regions 15, 16, 17, the housing 6 also has a corresponding recess to receive the screw. In each of the contacting regions 15, 16, 17 in the housing 6, a nut is inserted as a threaded part 18, 19, 20, into which the screw for securing the contactings can be inserted. The nuts 18, 19, 20 can also be injected into the housing 6. Two further nuts 21, 22 can also be used to secure the first contact electrode 7 of the first power semiconductor module 4 and the first contact electrode 9 of the second power semiconductor module 5 to the housing 6.

In FIG. 2, it can be seen how all four contact electrodes 7, 8, 9, 10 are electrically conductively connected with one another. For an external current/voltage source to be contacted, the four contact electrodes 7, 8, 9, 10 therefore function as a single electrical contacting of equal electrical potentials.

Figure 3:
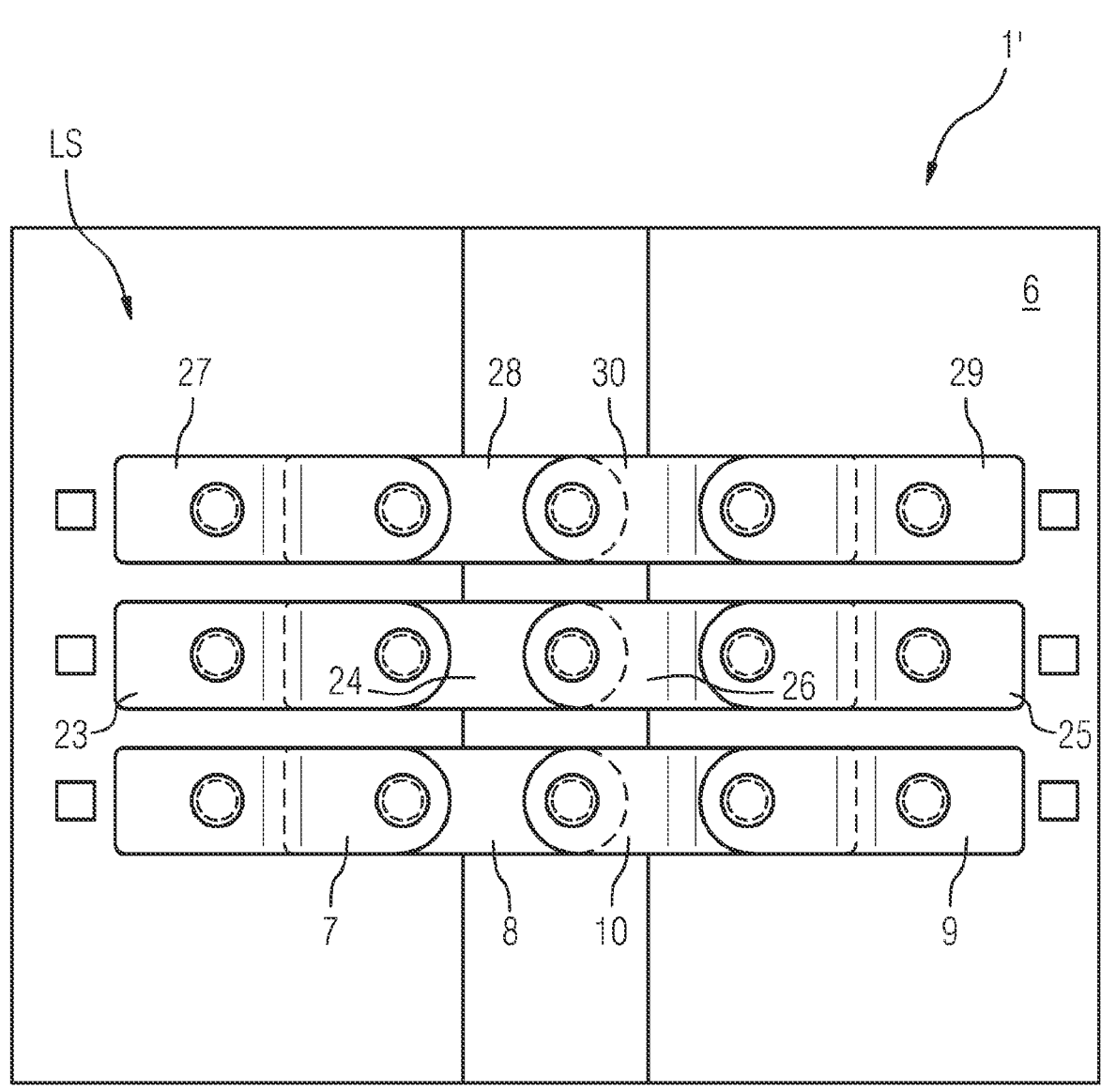
FIG. 3 is a top view of a power semiconductor module system in accordance with the invention.

The power semiconductor module system 1 is not restricted to three contacting regions 15, 16, 17 and four contact electrodes 7, 8, 9, 10. In FIG. 3 shows a top view of a power semiconductor module system 1'. This power semiconductor module system 1' has an integer multiple (of three) of two first contact electrodes 7, 9, 23, 25, 27, 29 and two second contact electrodes 8, 10, 24, 26, 28, 30, such that the power semiconductor module system 1' has a total of twelve contact electrodes 7, 8, 9, 10, 23, 24, 25, 26, 27, 28, 29, 30. The power semiconductor system 1' also has an integer multiple (of three) of three contacting regions 15, 16, 17 (for purposes of clarity these are not provided with reference characters in FIG. 3).

The housing 6 is configured substantially as a rectangle with four large-area longitudinal sides and two smaller-area end faces. In the top view of FIG. 3, one of the four longitudinal sides LS is shown with a relatively large area. The contacting regions 15, 16, 17 are located in a central region of the longitudinal side LS.

FIG. 3 shows how four contact electrodes 7, 8, 9, 10, or 23, 24, 25, 26, or 27, 28, 29, 30 are each electrically conductively connected with one another. For an external current/voltage source to be contacted, the three times four contact electrodes 7, 8, 9, 10, 23, 24, 25, 26, 27, 28, 29, 30 therefore function as three electrical contactings each with equal electrical potentials.

Figure 4:
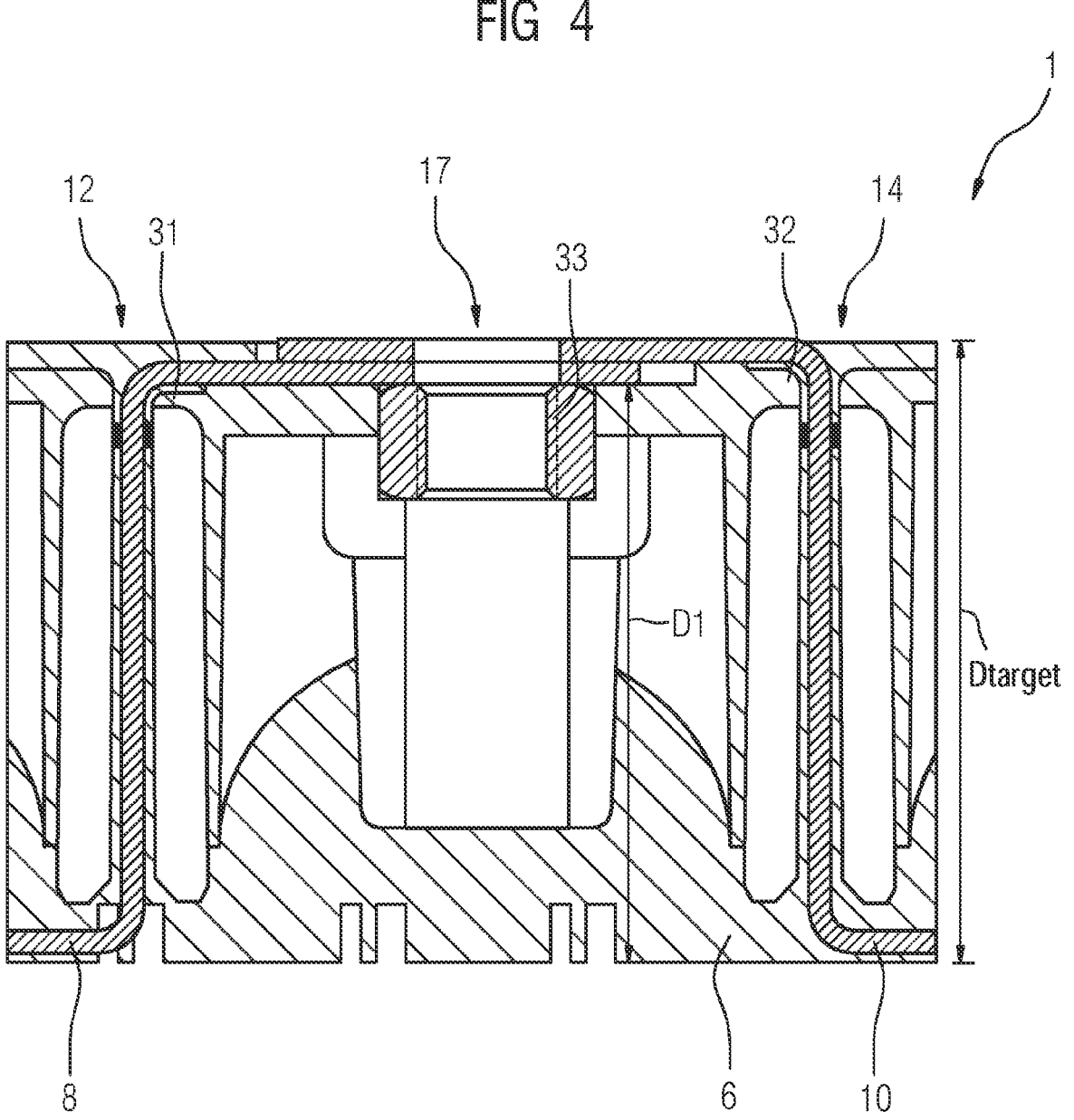
FIG. 4 is a cross-sectional illustration of a power semiconductor module system in accordance with the invention.

FIG. 4 shows a cross-section of the housing 6 of a power semiconductor module system 1 in accordance with the invention. The second contact electrode 8 of the first power semiconductor module 4 and the second contact electrode 10 of the second power semiconductor module system 5 are identifiable. The two contact electrodes 8, 10 are guided outward through the housing 6 and respectively bent around an edge 31, 32 of the housing 6. The edges 31, 32 each have a rounding to facilitate bending of the contact electrodes 8, 10 around the edges 31, 32.

In a region of the recesses 12, 14, through which the contact electrodes 8, 10 are guided outward through the housing 6, these are surrounded by an electrically insulating material. Both contact electrodes 8, 10 are thereby guided in the recesses 12, 14, whereby the forces resulting from the bending can be easily absorbed without damaging a connection between the contact electrodes 8, 10 and the respective power semiconductor circuit 2, 3.

In the third contacting region 17 of housing 6 shown in FIG. 4, in which the two contact electrodes 8, 10 can be contacted one above the other with an external voltage/current source (not shown), a thickness D1 of the housing 6 is configured, such that this corresponds to a target thickness Dtarget of the housing 6 minus the sum of the cross-sections of the two contact electrodes 8, 10. In other words, the housing 6 is recessed in the third contacting region 17 such that, with an arrangement of both contact electrodes 8, 10 in this region, an effective thickness of the housing 6 results that this should uniformly outwardly have.

Accordingly, the first contacting region 15 and the second contacting region 16 (not shown in FIG. 4) are each recessed by a total cross-section of the first contact electrode 7 and the second contact electrode 8 of the first power semiconductor module 4 or the first contact electrode 9 and the second contact electrode 10 of the second power semiconductor module 5 with respect to the target thickness Dtarget (not shown in FIG. 4).

The housing 6 has a recess in the third contacting regions 17 into which a threaded part 33 in the form of a nut is preferably inserted, where the recess, and preferably the threaded part, are configured to receive a screw to contact the contact electrodes (8, 10) in the third contacting region 17 with an external voltage/current source.

In the recess 12, through which the second contact electrode 8 of the first power semiconductor module 4 is guided outward through the housing 6, a wall of the recess 12 functions as a lateral guide (indicated by arrows), which absorbs the forces resulting during the bending of the contact electrode 8 and in particular protects the connection of the contact electrode 8 to the power semiconductor circuit 4 from damage. The other recesses 11, 13, 14 for the other contact electrodes 7, 9, 10 are comparably configured.

Figure 5:
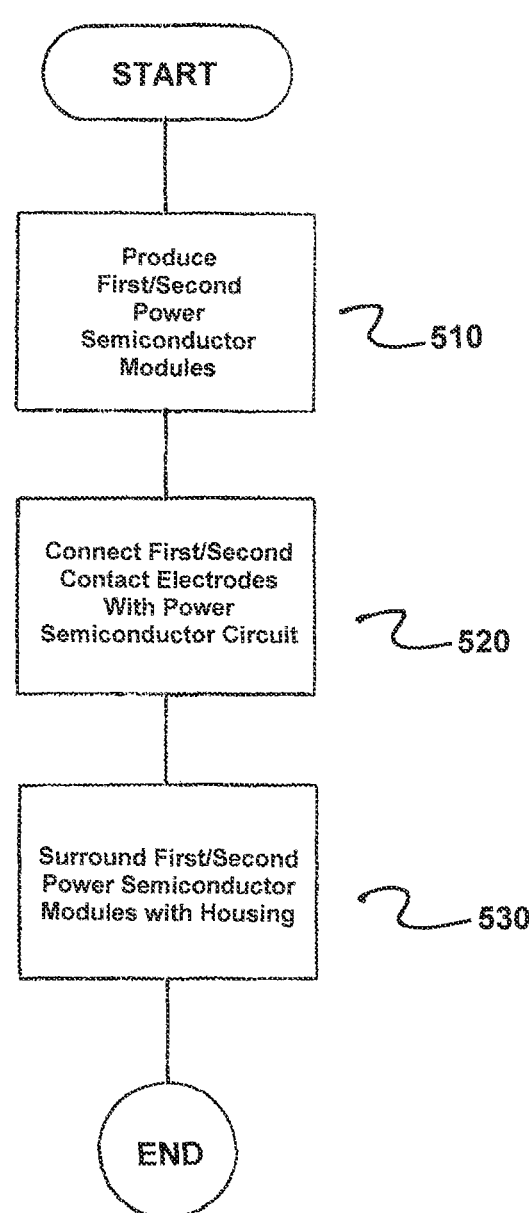
FIG. 5 is a flowchart of the method in accordance with the invention.

FIG. 5 is a flowchart of a method for producing a power semiconductor module system 1, 1'. The method comprises a) producing a first power semiconductor module 4 and a second power semiconductor module 5, as indicated in step 510. In accordance with the method, the first and second power semiconductor modules 4, 5 each include a respective power semiconductor circuit 2, 3.

Next, b) a first contact electrode 7, 9, 23, 25, 27, 29 and a second contact electrode 8, 10, 24, 26, 28, 30 are connected with the respective power semiconductor circuit 2, 3 via soldering or ultrasound welding, as indicated in step 520.

Next, c) the first and second power semiconductor modules 4, 5 are at least partially surrounded with a common housing 6, as indicated in step 530.

In accordance with the method, the first contact electrode 7, 9, 23, 25, 27, 29 and the second contact electrode 8, 10, 24, 26, 28, 30 of the first and second power semiconductor modules 4, 5 are each outwardly guided through the common housing 6 through a recess 11, 12, 13, 14 in the common housing 6.

In accordance with the method, the common housing 6 includes a first contacting region 15, a second contacting region 16 and a third contacting region 17, in the first contacting region 15 the first contact electrode 7, 23, 27 and the second contact electrode 8, 24, 28 of the first power semiconductor module 4 are contactable together, in the second contacting region 16 the first contact electrode 9, 25, 29 and the second contact electrode 10, 26, 30 of the second power semiconductor module 5 are contactable together and in the third contacting region 17 the second contact electrode 8, 24, 28 of the first power semiconductor module 4 and the second contact electrode 10, 26, 30 of the second power semiconductor module 5 are contactable together.

Thus, while there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention.

For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A power semiconductor module system, comprising:
a first power semiconductor module;
a second power semiconductor module; and
a common housing;
wherein each power semiconductor module includes a power semiconductor circuit;
wherein the common housing at least partially surrounds the power semiconductor circuits;
wherein each power semiconductor module includes a first contact electrode and a second contact electrode, the first and second contact electrode each being electrically conductively connected to the power semiconductor circuit and each being outwardly guided through the common housing through a recess in the housing;
wherein the common housing includes a first contacting region, a second contacting region and a third contacting region;
wherein the first contact electrode and the second contact electrode of the first power semiconductor module are contactable together in the first contacting region;
wherein the first contact electrode and the second contact electrode of the second power semiconductor module are contactable together in the second contacting region; and
wherein the second contact electrode of the first power semiconductor module and the second contact electrode of the second power semiconductor module are contactable together in the third contacting region.

2. The power semiconductor module system as claimed in claim 1, wherein the first contact electrode and the second contact electrode of the first power semiconductor module are contacted together in the first contacting region with an external voltage/current source;
wherein the first contact electrode and the second contact electrode of the second power semiconductor module are contacted together in the second contacting region with an external voltage/current source; and
wherein the second contact electrode of the first power semiconductor module and the second contact electrode of the second power semiconductor module are contacted together in the third contacting region with an external voltage/current source.

3. The power semiconductor module system as claimed in claim 1, further comprising:
an integer multiple of two first contact electrodes and two second contact electrodes and a multiple of three contacting regions;
wherein the integer multiple of two first and second contact electrodes and the multiple of three contacting regions are each configured on the common housing.

4. The power semiconductor module system as claimed in claim 2, further comprising:

an integer multiple of two first contact electrodes and two second contact electrodes and a multiple of three contacting regions;
wherein the integer multiple of two first and second contact electrodes and the multiple of three contacting regions are each configured on the common housing.

5. The power semiconductor module system as claimed in claim 1, wherein the first contact electrode and the second contact electrode are each bent around two edges of the common housing.

6. The power semiconductor module system as claimed in claim 5, wherein the two edges include a rounding which facilitates bending of the first and second contact electrodes.

7. The power semiconductor module system as claimed in claim 1, wherein the first and second contact electrodes in a region of a respective recesses, through which the first and second contact electrodes are outwardly guided through the common housing, are surrounded by an electrically insulating material.

8. The power semiconductor module system as claimed in claim 1, wherein the common housing includes a recess in each of the contacting regions, in which a threaded part is inserted, wherein the recess, and the threaded part, are configured to receive a screw to contact the first and second contact electrodes in each contacting region of the multiple of three contacting regions with an external voltage/current source on an outer face of the common housing; and
wherein the first and second contact electrodes further include a recess for receiving the screw.

9. The power semiconductor module system as claimed in claim 8, wherein each recess is configured as a longitudinally extended hole.

10. The power semiconductor module system as claimed in claim 1, wherein the common housing is configured substantially as a rectangle with four large-area longitudinal sides and two smaller-area end faces; and wherein the multiple of three contacting regions are located in a central region of one longitudinal side of the four longitudinal sides.

11. A housing for a power semiconductor module system, wherein the power semiconductor module system is configured as claimed in claim 1.

12. A power semiconductor module system assembly having a plurality of power semiconductor module systems configured as claimed in claim 1.

13. A method for producing a power semiconductor module system, comprising:
a) producing a first power semiconductor module and a second power semiconductor module, the first and second power semiconductor modules each including a respective power semiconductor circuit;
b) connecting a first contact electrode and a second contact electrode with the respective power semiconductor circuit via soldering or ultrasound welding;
c) surrounding at least partially the first and second power semiconductor modules with a common housing, the first contact electrode and the second contact electrode of the first and second power semiconductor modules each being outwardly guided through the common housing through a recess in the common housing;
wherein the common housing includes a first contacting region, a second contacting region and a third contacting region;
wherein the first contact electrode and the second contact electrode of the first power semiconductor module are contactable together in the first contacting region;

wherein the first contact electrode and the second contact electrode of the second power semiconductor module are contactable together in the second contacting region; and wherein the second contact electrode of the first power semiconductor module and the second contact electrode of the second power semiconductor module are contactable together in the third contacting region.

14. The method as claimed in claim 13, wherein the first contact electrode of the first power semiconductor module and the second contact electrode of the first power semiconductor module are bent and contacted together in the first contacting region of the common housing with an external voltage/current source, and the first contact electrode of the second power semiconductor module and the second contact electrode of the second power semiconductor module are bent and contacted together in the second contacting region of the common housing with an external voltage/current source, and the second contact electrode of the first power semiconductor module and the second contact electrode of the second power semiconductor module are bent and contacted together in the third contacting region of the common housing with an external voltage/current source; and wherein each contact occurs via a screw.

* * * * *